United States Patent [19]

Moreland

[11] Patent Number: 5,534,794
[45] Date of Patent: Jul. 9, 1996

[54] SELECTABLE LOGIC OUTPUT STAGE

[75] Inventor: Carl W. Moreland, Greensboro, N.C.

[73] Assignee: Analog Devices, Inc., Norwood, Mass.

[21] Appl. No.: 347,710

[22] Filed: Dec. 1, 1994

[51] Int. Cl.$^6$ .............................................. H03K 19/0175
[52] U.S. Cl. .............................. 326/63; 326/37; 326/65; 326/66; 326/80
[58] Field of Search ........................ 326/37, 63, 65–67, 326/70, 73–74, 76–78, 80

[56] References Cited

U.S. PATENT DOCUMENTS

| | | | |
|---|---|---|---|
| 4,472,647 | 9/1984 | Allgood et al. | 326/65 |
| 4,527,079 | 7/1985 | Thompson | 326/74 |
| 4,625,129 | 11/1986 | Ueno | 326/78 |
| 5,036,224 | 7/1991 | Wendell | 326/77 |
| 5,140,196 | 8/1992 | Shepherd | 326/64 |
| 5,322,935 | 7/1994 | Shyu | 326/73 |
| 5,428,305 | 6/1995 | Wong et al. | 326/75 |

Primary Examiner—David R. Hudspeth
Attorney, Agent, or Firm—Hale and Dorr

[57] ABSTRACT

A logic output stage that may be part of a circuit that provides the circuit user with the ability to select the type of digital electronic format for the digital signals output from the circuit. The logic output stage may include separate sections for processing signals so that they will have one of a plurality of digital electronic formats. Moreover, in cases where two or more digital electronic formats are very close, a single section may be used to process digital signals to have these formats.

16 Claims, 2 Drawing Sheets

TTL
$V_{CC} = +5 \pm 5\%$

CMOS
$V_{DD} = +5$

ECL
$V_{EE} = -5.2 \pm 5\%$

5,534,794

SELECTABLE LOGIC OUTPUT STAGE

FIELD OF THE INVENTION

The present invention relates generally to circuits that may be used as output stages for digital circuits. More specifically, the present invention relates to circuits that may be used as output stages for digital circuits and such output stages may be used to generate output digital signals in specific digital electronic formats.

BACKGROUND OF THE INVENTION

In digital electronics, predetermined voltage levels represent one of two possible states at any point in a circuit. These states, HIGH and LOW, correspond to the "0" (false) and "1" (true) states of Boolean logic. Precise voltages are not necessary in digital electronics because all that is necessary is have two voltages that are distinguishable to represent the HIGH and LOW states.

There are three popular varieties of digital electronics. These are complementary metal oxide semiconductor ("CMOS"), transistor-transistor logic ("TTL"), and emitter-coupled logic ("ECL"). A variation of ECL is positive ECL ("PECL"). Each of these digital electronic varieties has a different format for output and input voltages corresponding to the HIGH and LOW states.

Referring to FIG. 1, the typical output and input voltages for HIGH and LOW states for TTL, +5 volt CMOS and ECL are shown. The shaded areas above the line are the ranges within which the output voltages for the LOW and HIGH states fall. The arrows associated with each of these ranges indicate the typical LOW and HIGH output voltage levels. The cross-hatched areas below the line are the ranges within which the input voltages for the LOW and HIGH states fall. The arrow below each line indicates the typical threshold voltage dividing what is viewed as a LOW state from a HIGH state.

As can be readily understood from FIG. 1, if an output stage of a circuit is configured for the format of one of these popular varieties of digital electronic, it, in many cases, would not be compatible for any of the other formats. This also extends to other digital electronic formats that are not as popular.

Therefore, it is desirable to have a single logic output stage that is capable of selectably generating output digital signals having one of a plurality of formats, thereby obviating the need to construct a logic output stage for each format.

SUMMARY OF THE INVENTION

The present invention is a logic output stage that may be part of a larger circuit. This logic output stage provides the circuit user with the capability of selecting the type of digital electronic format that the digital signals output from the circuit will have. More specifically, the logic output stage of the present invention permits the user to select from a wide variety of formats for the output digital signals with regard to the voltage levels for the LOW and HIGH states, even though these formats may differ greatly, such as the voltage levels for the HIGH and LOW states for +5 volt CMOS and ECL.

The logic output stage of the present invention may include separate sections for generating output digital signals for each of a plurality of digital electronic formats. For example, a first section of the logic output stage could generate the output digital signals for +3 volt CMOS, +5 volt CMOS, and TTL formats. Similarly, a second section of the logic output stage could generate output digital signals for ECL and PECL level formats. Regardless of the number of separate sections of the logic output stage of the present invention, each of these sections connect to a common input and a common output. The invention also can be carried out with a single section that generates out-put digital signals for each of a plurality of digital electronic formats.

An object of the present invention is to provide a selectable logic output stage that permits a user to select the digital electronic format for the digital signals output from the stage.

Another object of the present invention is to provide a selectable logic output stage that may include multiple sections for generating output digital signals and the digital signals output from each of these sections may have a different digital electronic format.

A further object of the present invention is to provide a selectable logic output stage that has a first section for generating output digital signals with an ECL or a PECL digital electronic format, and a second section for generating output digital signals with a +3 volt CMOS +5 volt CMOS, or TTL digital electronic format.

The present invention will be described in detail in the remainder in the specification referring to the attached drawings.

DETAILED DESCRIPTION OF THE INVENTION

The present invention is a selectable logic output stage that may be used, for example, with an analog-to-digital converter or other type of circuitry. This selectable logic output stage is capable of generating output digital signals that may have one of a plurality of digital electronic formats. This selectable logic output stage is a single circuit that gives the end-user the ability to choose the digital electronic format that he or she desires for his or her output digital signals. This obviates the need to design separate versions of a device for each digital electronic format.

Figure 1:
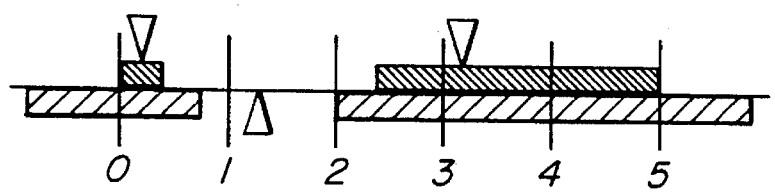
FIG. 1 shows the output and input voltage ranges, and the transition points for three (3) popular digital electronic formats, namely, TTL, +5 volt CMOS and ECL.
Figure 1:
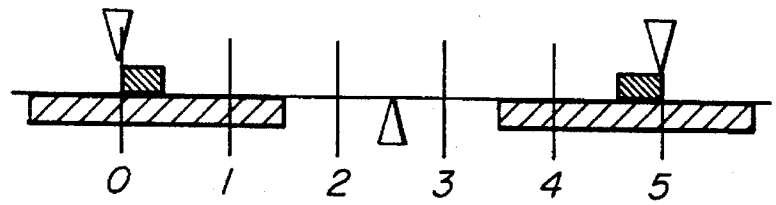
Figure 1:
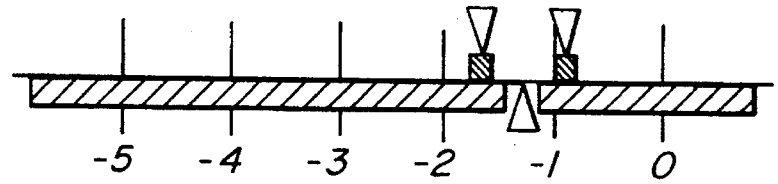
Figure 2:
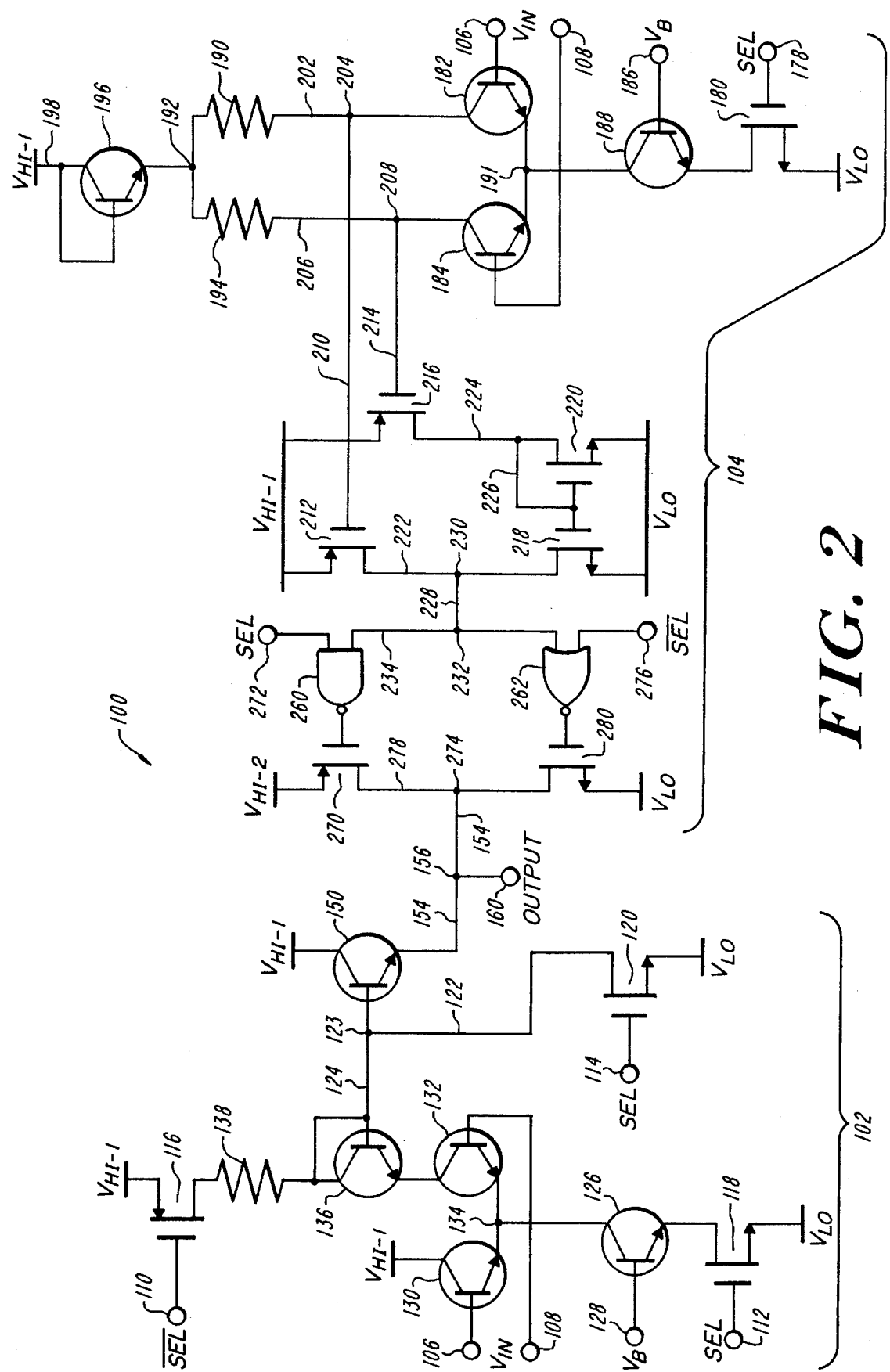
FIG. 2 is a schematic drawing of the selectable logic output stage of the present invention.

Referring to FIG. 2, the selectable logic output stage of the present invention is shown generally at 100. This logic output stage includes first section 102 that may be used to generate output digital signals for ECL and PECL digital electronic formats, and second section 104 that may be used to generate output signals for TTL, +5 volt CMOS, and +3 volt CMOS digital electronic formats. The selectable logic output stage of the present invention may be implemented in a silicon semiconductor chip along with the other circuitry of the device to which the selectable logic output stage of the present invention is part or may be implemented as a separate circuit of discrete elements. The remainder of the specification will describe in detail the selectable logic output stage of the present invention. In describing the present invention, first section 102 will be described first, then second section 104 will be described.

Again referring to FIG. 2, when it is desired to output digital signals with either an ECL or a PECL digital electronic format, first section 102 is selected by the user. The user selects first section 102 by providing the appropriate $\overline{\text{SEL}}$ and SEL signals to nodes 110, 112, and 114 for appropriately turning on or off certain transistors of that are used as switches, as will be described.

Node 110 connects to the gate of PMOS field effect transistor ("FET") 116. Therefore, when a $\overline{\text{SEL}}$ signal of the appropriate voltage level is applied to the gate of FET 116, the transistor will turn on. Node 112 connects to the gate of NMOS FET 118. When a $\overline{\text{SEL}}$ signal of the appropriate voltage level is applied to the gate of FET 118, this FET will turn on.

When it is desired to select first section 102, it also is necessary for NMOS FET 120 to be turned off. Node 114 connects to the gate of NMOS FET 120. To turn off transistor 120, a $\overline{\text{SEL}}$ signal of the appropriate voltage level is applied via node 114 to the gate of FET 120, thereby turning off this FET.

Bipolar npn transistor 126 has a controllable voltage, $V_B$, applied to its base via node 128. This signal is of an appropriate level to cause transistor 126 to continually conduct whenever first section 102 is selected. Bipolar npn transistor 126 is being used as a current source in first section 102.

When first section 102 is not selected, NMOS FET 120 is turned on, PMOS FET 116 is turned off, and NMOS FET 118 is turned off. When NMOS FET 120 is turned on, the $V_{LO}$ voltage that is connected to its source is supplied to line 124 via line 122 and node 123 to ensure there is no current flow through bipolar npn transistor 150 since transistor 150 is used to provide the ECL or PECL voltage levels to output node 160, as will be described.

In operation, the digital signals to be output from the primary circuit are input to selectable logic output stage 100. The portion of selectable logic output stage 100 that receives these signals is the differential input at $V_{IN}$, which consists of inputs 106 and 108. Now assuming that PMOS FET 116 is turned on and NMOS FET 118 and 120 are turned on and turned off, respectively, the differential inputs at input nodes 106 and 108 are applied to the bases of bipolar npn transistors 130 and 132, respectively.

The differential input portion consists of an emitter-coupled transistor pair that includes npn bipolar transistors 130 and 132. The emitters of these transistors connect to common node 134 and common node 134 connects to $V_{LO}$ through npn bipolar transistor 126 and NMOS FET 118. The collector of transistor 130 connects directly to $V_{HI-1}$, while the collector of npn transistor 132 connects to $V_{HI-1}$ via npn bipolar transistor 136, load resistor 138, and PMOS FET 116. Load resistor 138 and bipolar transistor 126 are used to set the voltage at the collector of npn transistor 136.

The collector of npn bipolar transistor 136 is coupled to its base. Line 124 couples the base of npn bipolar transistor 136 to the base of npn bipolar transistor 150. As discussed, the drain of NMOS FET 120 connects to line 124 via line 122 and node 123. The collector of npn bipolar transistor 150 connects directly to $V_{HI-1}$ and its emitter connects to output node 160 via line 154 and node 156.

When the digital signals that are input to nodes 106 and 108, respectively, have the appropriate level, they will cause the bipolar npn transistors 130 and 132 to conduct. The differential input signals provide a single-ended signal on line 124. This signal is input to the base of npn bipolar transistor 150. The signal at the base of npn bipolar transistor 150 will cause current flow in npn bipolar transistor which will provide ECL or PECL level output digital signals on line 154 for output from output 160.

In first section 102, preferably, $V_{HI-1}$ is +5 volts and $V_{LO}$ is 0 volts. Given these preferred levels for $V_{HI-1}$ and $V_{LO}$, the HIGH and LOW logic levels signals at output node 160 for PECL compatible signals will be +4.2 volts for the HIGH state and +3.2 volts for the LOW state. Alternatively, when $V_{HI-1}$ is 0 volts and $V_{LO}$ is −5.2 volts, the ECL compatible signals will be −0.8 volts for the HIGH state and −1.8 volts for the LOW state.

When the end-user desires that the digital signals output from output 160 have a TTL, +3 volt CMOS, or +5 volt CMOS digital electronic formats, second section 104 is selected. Since only first section 102 or second section 104 may be used at any given time, if it is desired to use second section 104, then first section 102 must be deselected. Accordingly, the appropriate signals are applied to the gates of PMOS FET 116 and NMOS FET 118 to turn off these transistors, and the appropriate signal is applied to NMOS FET 120 to turn on this transistor. Following this, the appropriate voltage level for the $\overline{\text{SEL}}$ signal is applied to node 178 to turn on NMOS FET 180. Further, an appropriate voltage level for the $\overline{\text{SEL}}$ signal, which is indicative of a logic HIGH, is applied to node 272 that connects to one of the inputs of NAND gate 260. Also, an appropriate voltage level for the $\overline{\text{SEL}}$ signal, which is indicative of a logic LOW, is applied to node 276 that connects to one of the inputs of NOR gate 262.

If zener breakdown is a concern for transistor 150, NMOS FET 120 may be replaced by a CMOS bilateral switch that connects across nodes 123 and 156.

In describing second section 104, preferably, $V_{HI-1}$ is +5 volts and $V_{LO}$ is 0 volts as in first section 102. Further, preferably $V_{HI-2}$ is +3 volts for 3 volt CMOS, and +5 volts for TTL and +5 volt CMOS. Second section 104 and its operation will now be discussed.

The differential input at $V_{IN}$, which consists of inputs 106 and 108, preferably is the same as $V_{IN}$ in first section 102. These are the common inputs for first section 102 and second section 104.

The digital signals input to the logic output stage of the present invention are applied to nodes 106 and 108. The differential digital input connects to the emitter-coupled transistor pair consisting of npn bipolar transistors 182 and 184. Specifically, the differential signal input to node 106 is connected to the base of npn bipolar transistor 182 and the differential signal input to node 108 is connected to the base of npn bipolar transistor 184. The emitters of these two transistors connect to common node 191 which connects to $V_{LO}$ via npn bipolar transistor 188 and NMOS FIit 180.

The base of npn bipolar transistor 188 is connected to node 186. The signal input to node 186 is the controllable $V_B$ signal. $V_B$ is at a level that causes transistor 188 to continually conduct when second section 104 is selected. Npn bipolar transistor 188 is a current source for second section 104.

The collector of npn bipolar transistor 182 connects to load resistor 190, which connects to common node 192. Similarly, the collector of npn bipolar transistor 184 connects to load resistor 194, which connects to common node 192. Common node 192 connects to $V_{HI-1}$ via npn bipolar transistor 196. Transistor 196 has its base coupled to line 198. Line 198 connects between the collector of transistor 196 and $V_{HI-1}$. Load resistors 190 and 194, and current source npn bipolar transistor 188 set the voltage in the respective branches.

When NMOS FET 180 is turned on, npn bipolar input transistors 182 and 184 will conduct based on the differential input to their bases via nodes 106 and 108, respectively. When npn bipolar input transistor 182 conducts, a signal is generated at its collector and on line 202 that connects between the collector of transistor 182 and load resistor 190. This signal also is at node 204 on line 202. Node 204 via line 210 connects to the base of PMOS FET 212.

When npn bipolar input transistor 184 conducts, a signal is generated at its collector and on line 206 that connects between the collector of transistor 184 and load resistor 194. This signal also is at node 208 on line 206. Node 208 via line 214 connects to the base of PMOS FET 212.

The portion of section 104 that consists of PMOS FETs 212 and 216, and NMOS FETs 218 and 220 is used to convert the differential input logic to single-ended logic. Node 204, which connects to input npn bipolar transistor 182 via line 202, connects to the gate of PMOS FET 212. The source of PMOS FET 212 connects to $V_{HI-1}$ and its drain, via line 222, connects to the drain of NMOS FET 218, whose source connects to $V_{LO}$. Similarly, node 208, which connects to the collector of input npn bipolar transistor 184 via line 206, connects to the gate of PMOS FET 216. Further with respect to the conversion circuit, the source of PMOS FET 216 connects to $V_{HI-1}$ and its drain, via line 224, connects to the drain of NMOS FET 220, whose source connects to $V_{LO}$. The gates of PMOS FETs 218 and 220 are connected and line 226 connects the gates of these FETs to line 224.

When signals of the appropriate level are applied to the gates of PMOS FETs 212 and 216, one of these FET are turned on and a single-ended digital signal is supplied to line 228 via node 230 based on the differential inputs at npn bipolar transistors 182 and 184.

The single-ended signal on line 228 is supplied to node 232 in line 234. Line 234 connects to the second inputs to NAND gate 260 and NOR gate 262. With regard to NAND gate 260, as stated, when second section 104 is selected, the $\overline{SEL}$ signal has a voltage indicative of a logic HIGH which is applied to the first input of this logic gate. As such, when the second input also is a logic HIGH, the output of NAND gate 260 is a logic LOW which will turn on PMOS FET 270 since the output of NAND gate 260 is connected to the gate of PMOS FET 270.

PMOS FET 270 has its source connected to $V_{HI-2}$ and its drain to line 278. Its gate is connected to the output of NAND gate 260. Node 274 in line 278 connects to line 154, which connects to output 160 via node 156. As such, the digital signals generated when PMOS FET 270 is turned on are output at output 160.

Turning now to NOR gate 262, the first input to this gate, as described is the $\overline{SEL}$ signal that is indicative of a logic LOW. The second input is the digital signal on line 234. When this signal also is a logic LOW, the output of NOR gate is a logic HIGH, which is input to the gate of NMOS FET 280. This logic HIGH will turn on this transistor which has its source connected to $V_{LO}$ and its drain connected to line 278. Node 274 in line 278 is connected to line 154, which connects to output 160 via node 156. The digital signals generated when NMOS FET 280 is turned on are output at output 160.

Given the preferred levels for $V_{HI-2}$ and $V_{LO}$, the signals output from node 160 have HIGH and LOW logic levels of +3 volts and 0 volts, respectively, for +3 CMOS, and +5 volts and 0 volts for TTL and +5 volt CMOS.

The present invention has be described with respect to a differential input at $V_{IN}$, however, it is understood that the input section may be configured to be single-ended rather than differential and still be within the scope of the present invention.

The terms and expressions which are used herein are used as terms of expression and not of limitation. There is no intention in the use of such terms and expressions of excluding the equivalents of the features shown and described, or portions thereof, it being recognized that various modifications are possible in the scope of the present invention.

I claim:

1. A circuit that is capable of use as an output stage for generating digital signals that may have one of a plurality of digital electronic formats, comprising:

a first section that may be used to generate output digital signals having at least a first digital electronic format, the first section further including, a first input structure for receiving digital signals to be processed to have at least a first digital electronic format, first switch means for enabling and disabling the first section, first input receiving means for receiving digital signals output from the first input structure, first voltage setting means connected to the first input receiving means for setting a voltage of digital signals output from the first input receiving means, digital electronic format applying means connected to an output of the first input receiving means for applying a first desired digital electronic format to the digital signals output by the voltage setting means, and output means connected to the digital electronic format applying means for outputting the digital signals with at least the first desired digital electronic format output tom the circuit; and a second section that may be used to generate output digital signals having at least a second digital electronic format, the second section further including, a second input structure for receiving digital signals to be processed to have at least a second digital electronic format, second switch means for enabling and disabling the second section, second input receiving means for receiving digital signals output from the second input structure, second voltage setting means connected to the second input receiving means for setting a voltage of digital signals output from the second input receiving means, processing means connected to the second input receiving means for ensuring that the digital signals output therefrom are single-ended digital signals, logic means connected to the processing means for applying at least a second desired digital electronic format to the digital signals output from the processing means, and the output means connected to the logic means for outputting the digital signals with at least the second desired digital electronic format from the circuit.

2. The circuit as recited in claim 1, wherein the first section may be used to generate output digital signals having an emitter-coupled logic format.

3. The circuit as recited in claim 1, wherein the first section may be used to generate output digital signals having a positive emitter-coupled logic format.

4. The circuit as recited in claim 1, wherein the second section may be used to generate output digital signals having a transistor-transistor logic format.

5. The circuit as recited in claim 1, wherein the second section may be used to generate output digital signals having a +3 volt complimentary metal oxide semiconductor logic format.

6. The circuit as recited in claim 1, wherein the second section may be used to generate output digital signals having a +5 volt complimentary metal oxide semiconductor logic format.

7. The circuit as recited in claim 1, wherein the first switch means includes a plurality of user activated field effect transistors.

8. The circuit as recited in claim 1, wherein the first input receiving means includes a pair of differential transistors.

9. The circuit as recited in claim 8, wherein the pair of differential transistors includes emitter-coupled first and second npn bipolar transistors.

10. The circuit as recited in claim 1, wherein the voltage setting means includes at least a first load resistor and a first current source.

11. The circuit as recited in claim 1, wherein the digital electronic format applying means includes a third npn bipolar transistor.

12. The circuit as recited in claim 1, wherein the second switch means includes at least a user activated field effect transistor.

13. The circuit as recited in claim 1, wherein the second input receiving means includes a pair of differential transistors.

14. The circuit as recited in claim 13, wherein the pair of differential transistors includes emitter-coupled fourth and fifth npn bipolar transistors.

15. The circuit as recited in claim 1, wherein the voltage setting means includes at least second and third load resistors and a second current source.

16. The circuit as recited in claim 1, wherein the logic means includes at least a NAND gate and coupled field effect transistor for applying a first format logic voltage level to the digital signals processed by the logic means, and a NOR and coupled field effect transistor for applying a second format logic voltage level to the digital signals processed by the logic means.

\* \* \* \* \*